(12) United States Patent
Li et al.

(10) Patent No.: US 11,087,668 B1
(45) Date of Patent: Aug. 10, 2021

(54) SHIFT REGISTER UNIT AND DRIVING METHOD THEREOF, GATE DRIVING CIRCUIT

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Meng Li, Beijing (CN); Yongqian Li, Beijing (CN); Zhidong Yuan, Beijing (CN); Can Yuan, Beijing (CN); Zhenfei Cai, Beijing (CN); Xuehuan Feng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 447 days.

(21) Appl. No.: 16/312,101

(22) PCT Filed: Jan. 4, 2018

(86) PCT No.: PCT/CN2018/071296
§ 371 (c)(1),
(2) Date: Dec. 20, 2018

(87) PCT Pub. No.: WO2019/015267
PCT Pub. Date: Jan. 24, 2019

(30) Foreign Application Priority Data

Jul. 20, 2017 (CN) .......................... 201710594509.7

(51) Int. Cl.
*G09G 3/20* (2006.01)
*G09G 3/3258* (2016.01)

(52) U.S. Cl.
CPC ......... *G09G 3/2092* (2013.01); *G09G 3/3258* (2013.01); *G09G 2300/0426* (2013.01); *G09G 2310/0286* (2013.01); *G09G 2310/08* (2013.01)

(58) Field of Classification Search
CPC ............... G09G 3/2092; G09G 3/3285; G09G 2300/0426; G09G 2310/0286; G09G 2310/08
See application file for complete search history.

(56) References Cited

U.S. PATENT DOCUMENTS

2016/0307537 A1   10/2016   Park et al.

FOREIGN PATENT DOCUMENTS

| CN | 102654982 A | 9/2012 |
| CN | 104134430 A | 11/2014 |

(Continued)

OTHER PUBLICATIONS

European Extended Search Report, Application No. 18825852.9, dated Dec. 14, 2020, 11 pps.

(Continued)

*Primary Examiner* — Michael Pervan
(74) *Attorney, Agent, or Firm* — Armstrong Teasdale LLP (57) ABSTRACT

Embodiments of the present disclosure provide a shift register unit and a driving method thereof, and a gate driving circuit. The shift register unit includes an input circuit, a next-stage start circuit, a control circuit, a stabilization circuit, and at least one output circuit. The at least one output circuit each can control a voltage of a signal output terminal according to a voltage of a pull-up node, a voltage of a pull-down node, a first voltage signal, a control clock signal from a control clock signal terminal, and a control voltage signal from a control voltage signal terminal. A high level of a second clock signal begins when a high level of a first (Continued)

clock signal ends, and a high level of a third clock signal begins when a high level of the second clock signal ends.

20 Claims, 5 Drawing Sheets

(56) References Cited

FOREIGN PATENT DOCUMENTS

| CN | 104464665 A | 3/2015 |
|---|---|---|
| CN | 104517575 A | 4/2015 |
| CN | 105609135 A | 5/2016 |
| CN | 106887217 A | 6/2017 |
| KR | 20140098880 A | 8/2014 |

OTHER PUBLICATIONS

Indian Examination Report, Application No. 20197000966, dated Dec. 31, 2020, 6 pps.
PCT International Search Report, Application No. PCT/CN2018/071296, dated Apr. 18, 2018, 6 pages: with English translation.
PCT Written Opinion, Application No. PCT/CN2018/071296, dated Apr. 18, 2018, 5 pages.: with English translation of relevant part.

In a first period, input a first clock signal through a first clock signal terminal, and input a trigger signal through a trigger signal terminal, such that an input circuit is Enabled to increase a voltage of a pull-up node, a control circuit controls a voltage of a pull-down node to be a low level, a next-stage start circuit outputs a low level signal, and the respective output circuit outputs a low level signal — S610

In a second period, input a second clock signal through a second clock signal terminal, such that the next-stage start circuit is enabled to output a high level signal, the voltage of the pull-up node continues to rise to a high level again, the voltage of the pull-down node is maintained at low, and the respective output circuit outputs a high level signal — S620

In a third period, input a third clock signal through a third clock signal terminal such that a stabilization circuit is enabled to change the voltage of the pull-up node to a low level and change the voltage of the pull-down node to a high level, the next-stage start circuit outputs a low level signal, and the respective output circuit outputs a low level signal — S630

SHIFT REGISTER UNIT AND DRIVING METHOD THEREOF, GATE DRIVING CIRCUIT

CROSS REFERENCE TO RELATED APPLICATIONS

This patent application is a National Stage Entry of PCT/CN2018/071296 filed on Jan. 4, 2018, which claims the benefit and priority of Chinese Patent Application No. 201710594509.7 filed on Jul. 20, 2017, the disclosures of which are incorporated by reference in their entirety as part of the present application.

BACKGROUND

The present disclosure relates to the field of display technologies, and in particular, to a shift register unit and a driving method thereof, a gate driving circuit, an array substrate, and a display device.

With the advancement of display technologies, compared with conventional liquid crystal display (LCD) devices, a new generation of organic light emitting diode (OLED) display devices has advantages of lower manufacturing costs, a faster response speed, higher contrast, a wider viewing angle, a greater operating temperature range, being without the need for a backlight unit, and being colorful and thin. Therefore, the OLED display technology has become the fastest growing display technology.

In order to improve process integration level and reduce the cost of an OLED panel, a Gate Driver on Array (GOA) technology is usually used, such that a gate switch circuit of a thin film transistor (TFT) can be integrated on an array substrate of the display panel, to form scan driving of the display panel. The gate driving circuit integrated on an array substrate using the GOA technology is also referred to as a GOA circuit or a shift register circuit. Both material and manufacturing process costs can be reduced by using the display device with the GOA circuit, since a binding part for the driving circuit is not required.

BRIEF DESCRIPTION

Embodiments of the present disclosure provide a shift register unit and a driving method thereof, a gate driving circuit, a substrate, and a display device.

A first aspect of the present disclosure provides a shift register unit. The shift register unit includes an input circuit configured to provide a trigger signal from a trigger signal terminal to a first node according to a first clock signal from a first clock signal terminal, provide a voltage of the first node to a pull-up node according to the first clock signal, and provide a second clock signal from a second clock signal terminal to the first node according to a voltage of the pull-up node such that there is no leakage current flowing through the input circuit from the pull-up node, a next-stage start circuit configured to output a next-stage start signal from a next-stage start signal output terminal according to the voltage of the pull-up node, a voltage of a pull-down node, a second clock signal from a second clock signal terminal, and a first voltage signal from a first voltage signal terminal, a control circuit configured to control the voltage of the pull-down node according to the voltage of the pull-up node and a second voltage signal from a second voltage signal terminal, and control the voltage of the pull-up node according to the voltage of the pull-down node and the second voltage signal, a stabilization circuit configured to control the voltage of the pull-up node and the voltage of the pull-down node according to a third clock signal from a third clock signal terminal, the first voltage signal, and a third voltage signal from a third voltage signal terminal, and at least one output circuit each configured to output an output signal from a signal output terminal according to the voltage of the pull-up node, the voltage of the pull-down node, the first voltage signal, a control clock signal from a control clock signal terminal, and a control voltage signal from a control voltage signal terminal. A high level of the second clock signal begins when a high level of the first clock signal ends, and a high level of the third clock signal begins when a high level of the second clock signal ends.

In an embodiment of the present disclosure, each of the at least one output circuit includes a pull-up transistor, a pull-down transistor, and a control transistor. A control electrode of the pull-up transistor is coupled to the pull-up node, a first electrode of the pull-up transistor is coupled to the control voltage signal terminal, and a second electrode of the pull-up transistor is coupled to the signal output terminal. A control electrode of the pull-down transistor is coupled to the pull-down node, a first electrode of the pull-down transistor is coupled to the first voltage signal terminal, and a second electrode of the pull-down transistor is coupled to the signal output terminal. A control electrode of the control transistor is coupled to the control clock signal terminal, a first electrode of the control transistor is coupled to the first voltage signal terminal, and a second electrode of the control transistor is coupled to the signal output terminal.

In an embodiment of the present disclosure, the at least one output circuit includes a first output circuit configured to output a first output signal from a first signal output terminal according to the voltage of the pull-up node, the voltage of the pull-down node, the first voltage signal, a first control clock signal from a first control clock signal terminal, and a first control voltage signal from a first control voltage signal terminal, and a second output circuit configured to output a second output signal from a second signal output terminal according to the voltage of the pull-up node, the voltage of the pull-down node, the first voltage signal, a second control clock signal from a second control clock signal terminal, and a second control voltage signal from a second control voltage signal terminal.

In an embodiment of the present disclosure, the input circuit includes a first transistor, a second transistor, and a twelfth transistor. A control electrode of the first transistor is coupled to the first clock signal terminal, a first electrode of the first transistor is coupled to the trigger signal terminal, and a second electrode of the first transistor is coupled to the first node. A control electrode of the second transistor is coupled to the first clock signal terminal, the first electrode of the second transistor is coupled to the first node, and a second electrode of the second transistor is coupled to the pull-up node. A control electrode of the twelfth transistor is coupled to the pull-up node, a first electrode of the twelfth transistor is coupled to the first node, and a second electrode of the twelfth transistor is coupled to the second clock signal terminal.

In an embodiment of the present disclosure, the next-stage start circuit includes a fourth transistor, a fifth transistor, and a first capacitor. A control electrode of the fourth transistor is coupled to the pull-up node, a first electrode of the fourth transistor is coupled to the second clock signal terminal, and a second electrode of the fourth transistor is coupled to the next-stage start signal output terminal. A control electrode of the fifth transistor is coupled to the pull-down node, a first electrode of the fifth transistor is coupled to the first voltage signal terminal, and a second electrode of the fifth transistor is coupled to the next-stage start signal output terminal. The first capacitor is coupled between the pull-up node and the next-stage start signal output terminal.

In an embodiment of the present disclosure, the control circuit includes a third transistor and a fifteenth transistor. A control electrode of the third transistor is coupled to the pull-down node, a first electrode of the third transistor is coupled to the second voltage signal terminal, and a second electrode of the third transistor is coupled to the pull-up node. A control electrode of the fifteenth transistor is coupled to the pull-up node, a first electrode of the fifteenth transistor is coupled to the second voltage signal terminal, and a second electrode of the fifteenth transistor is coupled to the pull-down node.

In an embodiment of the present disclosure, the stabilization circuit includes a thirteenth transistor and a fourteenth transistor. A control electrode of the thirteenth transistor is coupled to the third clock signal terminal, a first electrode of the thirteenth transistor is coupled to the first voltage signal terminal, and a second electrode of the thirteenth transistor is coupled to the pull-up node. A control electrode of the fourteenth transistor is coupled to the third clock signal terminal, a first electrode of the fourteenth transistor is coupled to the third voltage signal terminal, and a second electrode of the fourteenth transistor is coupled to the pull-down node.

In an embodiment of the present disclosure, the first output circuit includes a sixth transistor, a seventh transistor, and an eighth transistor. A control electrode of the sixth transistor is coupled to the pull-up node, a first electrode of the sixth transistor is coupled to the first control voltage signal terminal, and a second electrode of the sixth transistor is coupled to the first signal output terminal. A control electrode of the seventh transistor is coupled to the pull-down node, a first electrode of the seventh transistor is coupled to the first voltage signal terminal, and a second electrode of the seventh transistor is coupled to the first signal output terminal. A control electrode of the eighth transistor is coupled to the first control clock signal terminal, a first electrode of the eighth transistor is coupled to the first voltage signal terminal, and a second electrode of the eighth transistor is coupled to the first signal output terminal.

In an embodiment of the present disclosure, a width to length ratio of the seventh transistor is an integer multiple of a width to length ratio of the sixth transistor.

In an embodiment of the present disclosure, the second output circuit includes a ninth transistor, a tenth transistor, and an eleventh transistor. A control electrode of the ninth transistor is coupled to the pull-up node, a first electrode of the ninth transistor is coupled to the second control voltage signal terminal, and a second electrode of the ninth transistor is coupled to the second signal output terminal. A control electrode of the tenth transistor is coupled to the pull-down node, a first electrode of the tenth transistor is coupled to the first voltage signal terminal, and a second electrode of the tenth transistor is coupled to the second signal output terminal. A control electrode of the eleventh transistor is coupled to the second control clock signal terminal, a first electrode of the eleventh transistor is coupled to the first voltage signal terminal, and a second electrode of the eleventh transistor is coupled to the second signal output terminal.

In an embodiment of the present disclosure, a width to length ratio of the tenth transistor is an integer multiple of a width to length ratio of the ninth transistor.

In an embodiment of the present disclosure, the first clock signal, the second clock signal, and the third clock signal have a same clock period and a same ratio of high level to low level of 1:2.

In an embodiment of the present disclosure, a potential of the first voltage signal is higher than a potential of the second voltage signal.

A second aspect of the present disclosure provides a shift register unit. The shift register include a first transistor, a second transistor, a twelfth transistor, a fourth transistor, a fifth transistor, a first capacitor, a third transistor, a fifteenth transistor, a thirteenth transistor, a fourteenth transistor, a sixth transistor, a seventh transistor, an eighth transistor, a ninth transistor, a tenth transistor, and an eleventh transistor. A control electrode of the first transistor is coupled to a first clock signal terminal, a first electrode of the first transistor is coupled to a trigger signal terminal, and a second electrode of the first transistor is coupled to a first electrode of the second transistor. A control electrode of the second transistor is coupled to the first clock signal terminal, the first electrode of the second transistor is coupled to the second electrode of the first transistor, and a second electrode of the second transistor is coupled to a pull-up node. A control electrode of the twelfth transistor is coupled to the pull-up node, a first electrode of the twelfth transistor is coupled to the first electrode of the second transistor, and a second electrode of the twelfth transistor is coupled to a second clock signal terminal. A control electrode of the fourth transistor is coupled to the pull-up node, a first electrode of the fourth transistor is coupled to the second clock signal terminal, and a second electrode of the fourth transistor is coupled to a next-stage start signal output terminal. A control electrode of the fifth transistor is coupled to a pull-down node, a first electrode of the fifth transistor is coupled to a first voltage signal terminal, and a second electrode of the fifth transistor is coupled to the next-stage start signal output terminal. The first capacitor is coupled between the pull-up node and the next-stage start signal output terminal. A control electrode of the third transistor is coupled to the pull-down node, a first electrode of the third transistor is coupled to a second voltage signal terminal, and a second electrode of the third transistor is coupled to the pull-up node. A control electrode of the fifteenth transistor is coupled to the pull-up node, a first electrode of the fifteenth transistor is coupled to the second voltage signal terminal, and a second electrode of the fifteenth transistor is coupled to the pull-down node. A control electrode of the thirteenth transistor is coupled to a third clock signal terminal, a first electrode of the thirteenth transistor is coupled to the first voltage signal terminal, and a second electrode of the thirteenth transistor is coupled to the pull-up node. A control electrode of the fourteenth transistor is coupled to the third clock signal terminal, a first electrode of the fourteenth transistor is coupled to a third voltage signal terminal, and a second electrode of the fourteenth transistor is coupled to the pull-down node. A control electrode of the sixth transistor is coupled to the pull-up node, a first electrode of the sixth transistor is coupled to a first control voltage signal terminal, and a second electrode of the sixth transistor is coupled to a first signal output terminal. A control electrode of the seventh transistor is coupled to the pull-down node, a first electrode of the seventh transistor is coupled to the first voltage signal terminal, and a second electrode of the seventh transistor is coupled to the first signal output terminal. A control electrode of the eighth transistor is coupled to a first control clock signal terminal, a first electrode of the eighth transistor is coupled to the first voltage signal terminal, and a second electrode of the eighth transistor is coupled to the first signal output terminal. A control electrode of the ninth transistor is coupled to the pull-up node, a first electrode of the ninth transistor is coupled to a second control voltage signal terminal, and a second electrode of the ninth transistor is coupled to a second signal output terminal. A control electrode of the tenth transistor is coupled to the pull-down node, a first electrode of the tenth transistor is coupled to the first voltage signal terminal, and a second electrode of the tenth transistor is coupled to the second signal output terminal. A control electrode of the eleventh transistor is coupled to a second control clock signal terminal, a first electrode of the eleventh transistor is coupled to the first voltage signal terminal, and a second electrode of the eleventh transistor is coupled to the second signal output terminal.

A third aspect of the present disclosure provides a method for driving the shift register unit described above. A control clock signal of a control clock signal terminal of at least one output circuit is a low level signal. In the method, in a first period, a first clock signal is inputted through a first clock signal terminal, and a trigger signal is inputted through a trigger signal terminal, such that an input circuit is enabled to provide the trigger signal to a first node, and provide the voltage of the first node to a pull-up node, a control circuit controls a voltage of a pull-down node to be a low level, a next-stage start circuit outputs a low level signal, and the respective output circuit outputs a low level signal. In a second period, a second clock signal is inputted through a second clock signal terminal, such that a next-stage start circuit is enabled to output a high level signal, the voltage of the pull-up node continues rising to a high level, the voltage of the pull-down node is maintained at a low level, and the respective output circuit outputs a high level signal, a second clock signal is provided to the first node such that there is no leakage current flowing from the pull-up node. In a third period, a third clock signal is inputted through a third clock signal terminal, such that a stabilization circuit is enabled to change the voltage of the pull-up node to a low level and change the voltage of the pull-down node to a high level, the next-stage start circuit outputs a low level signal, and the respective output circuit outputs a low level signal.

In an embodiment of the present disclosure, the control clock signal of the control clock signal terminal of one or more of the at least one output circuit is a high level signal. The method includes outputting a low level signal from a signal output terminal of the one or more output circuits.

A fourth aspect of the present disclosure provides a gate driving circuit. The gate driving circuit includes a plurality of cascaded shift register units, wherein each shift register unit is a shift register unit as above. A next-stage start signal output terminal of the respective stages of shift register unit is coupled to a trigger signal terminal of the next stage of shift register unit. A first clock signal terminal of a (3n+1)-stage of shift register unit is coupled to a third clock signal terminal of a (3n+2)-stage of shift register unit and to a second clock signal terminal of a (3n+3)-stage of shift register unit. A second clock signal terminal of the (3n+1)-stage of shift register unit is coupled to a first clock signal terminal of the (3n+2)-stage of shift register unit and to a third clock signal terminal of the (3n+3)-stage of shift register unit. A third clock signal terminal of the (3n+1)-stage of shift register unit is coupled to a second clock signal terminal of the (3n+2)-stage of shift register unit and to a first clock signal terminal of the (3n+3)-stage of shift register unit. N is a positive integer.

A fifth aspect of the present disclosure provides an array substrate including the above-described gate driving circuit.

A sixth aspect of the present disclosure provides a display device including the above-described array substrate.

BRIEF DESCRIPTION OF THE DRAWINGS

In order to illustrate the technical solutions of the present disclosure more clearly, the drawings of the embodiments will be briefly described below. It should be appreciated that the drawings described below are only related to some of the embodiments of the present disclosure, rather than limiting the present disclosure, in which.

DETAILED DESCRIPTION

In order to make the technical solutions and advantages of the embodiments of the present disclosure clearer, the technical solutions of the embodiments of the present disclosure will be clearly and completely described below in conjunction with the accompanying drawings. Obviously, the described embodiments are merely part of the embodiments of the present disclosure, rather than all of the embodiments. According to the described embodiments, all the other embodiments obtained by those of ordinary skill in the art without creative labor also fall within the scope of protection of the present disclosure.

Hereinafter, the expression "the element A is coupled to the element B" means that the element A is "directly" connected to the element B or "indirectly" connected to the element B via one or more other elements, unless otherwise stated.

As used herein, unless otherwise stated, the singular form, "one", "this" or "the", is also intended to include the plural form.

The term "including" or "comprising", as used herein, refers to the presence of a feature, integer, step, operation, element, and/or part, but does not exclude the presence or addition of one or more other features, integers, steps, operations, components, components, and/or combinations thereof.

As used herein, the expressions "first", "second", etc. are used to distinguish two individual entities or parameters with the same name, so "first", "second", etc. are only for the convenience of the description and shall not be construed as limiting the embodiments of the present disclosure.

Figure 1:
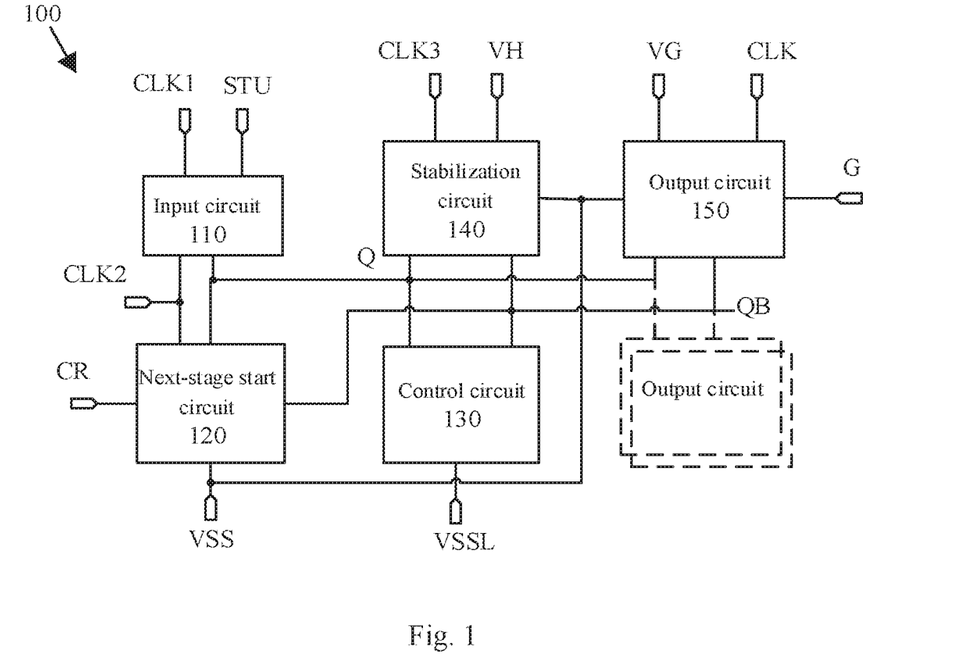
FIG. 1 is a schematic block diagram of a shift register unit according to an embodiment of the present disclosure.

FIG. 1 shows a schematic block diagram of a shift register unit 100 according to an embodiment of the present disclosure. As shown in FIG. 1, the shift register unit 100 may include an input circuit 110, a next-stage start circuit 120, a control circuit 130, a stabilization circuit 140, and at least one output circuit (in FIG. 1, only one output circuit 150 is shown as an example, and other output circuits are schematically illustrated by dashed blocks).

The input circuit 110 may be coupled to a first clock signal terminal CLK, a trigger signal terminal STU, a pull-up node Q, and a second clock signal terminal CLK2. The input circuit 110 may provide a trigger signal from the trigger signal terminal STU to a first node N1 (not shown in FIG. 1) according to a first clock signal from the first clock signal terminal CLK1. Moreover, the input circuit 110 may also provide a voltage of the first node N1 to the pull-up node Q according to a first clock signal from the first clock signal terminal CLK1. Specifically, the input circuit 110 may provide, under the control of the first clock signal from the first clock signal terminal CLK, the trigger signal from the trigger signal terminal STU to the pull-up node Q via the first node N1. Further, the input circuit 110 may provide a second clock signal from the second clock signal terminal CLK2 to the first node N1 according to a voltage of the pull-up node. In this way, a potential of the first node N1 is higher than a potential of the first clock signal when the first node control circuit is enabled according to the pull-up node Q. Therefore, there is no leakage current flowing through the input circuit from the pull-up node, and then the voltage of the pull-up node can be maintained.

The next-stage start circuit 120 may be coupled to the pull-up node Q, the second clock signal terminal CLK2, a pull-down node QB, a first voltage signal terminal VSS, and a next-stage start signal output terminal CR. The next-stage start circuit 120 may output a next-stage start signal from the next-stage start signal output terminal CR according to the voltage of the pull-up node Q, a voltage of the pull-down node QB, a second clock signal from the second clock signal terminal CLK2, and the first voltage signal from the first voltage signal terminal VSS. Specifically, the next-stage start circuit 120 may provide, under the control of the voltage of the pull-up node Q, the second clock signal from the second clock signal terminal CLK2 to the next-stage start signal output terminal CR. In addition, the next-stage start circuit 120 may also provide, under the control of the voltage of the pull-down node QB, the first voltage signal from the first voltage signal terminal VSS to the next-stage start signal output terminal CR.

The control circuit 130 may be coupled to the pull-up node Q, the pull-down node QB, and a second voltage signal terminal VSSL. The control circuit 130 may control the voltage of the pull-down node QB according to the voltage of the pull-up node Q and a second voltage signal from the second voltage signal terminal VSSL, and control the voltage of the pull-up node Q according to the voltage of the pull-down node QB and the second voltage signal. Specifically, the control circuit 130 may provide, under the control of the voltage of the pull-up node Q, the second voltage signal from the second voltage signal terminal VSSL to the pull-down node QB. In addition, the control circuit 130 may also provide the second voltage signal from the second voltage signal terminal VSSL to the pull-up node Q under the control of the voltage of the pull-down node QB.

The stabilization circuit 140 may be coupled to a third clock signal terminal CLK3, the first voltage signal terminal VSS, a third voltage signal terminal VH, the pull-up node Q, and the pull-down node QB. The stabilization circuit 140 may control the voltage of the pull-up node Q and the voltage of the pull-down node QB according to a third clock signal from the third clock signal terminal CLK3, the first voltage signal VSS from the first voltage signal terminal VSS, and a third voltage signal from the third voltage signal terminal VH. Specifically, the stabilization circuit 140 may provide the first voltage signal from the first voltage signal terminal VSS to the pull-up node Q under the control of the third clock signal from the third clock signal terminal CLK3. Further, the stabilization circuit 140 may also provide the third voltage signal from the third voltage signal terminal VH to the pull-down node QB under the control of the third clock signal from the third clock signal terminal CLK3.

The shift register unit 100 according to an embodiment of the present disclosure may include at least one output circuit. Each of the at least one output circuit is configured to output an output signal from a signal output terminal G, according to the voltage of the pull-up node Q, the voltage of the pull-down node QB, the first voltage signal VSS, a control clock signal from a control clock signal terminal CLK, and a control voltage signal from a control voltage signal terminal VG.

As shown in FIG. 1, the shift register unit 100 includes one output circuit 150 as an example. The output circuit 150 may be coupled to the pull-up node Q, the pull-down node QB, the first voltage signal terminal VSS, the control clock signal terminal CLK, the control voltage signal terminal VG, and the signal output terminal G. The output circuit 150 may output an output signal from the signal output terminal G according to the voltage of the pull-up node Q, the voltage of the pull-down node QB, the first voltage signal VSS, the control clock signal from the control clock signal terminal CLK, and the control voltage signal from the control voltage signal terminal VG. Specifically, the output circuit 150 may provide the control voltage signal from the control voltage signal terminal VG to the signal output terminal G under the control of the voltage of the pull-up node Q. In addition, the output circuit 150 may also provide the first voltage signal from the first voltage signal terminal VSS to the signal output terminal G under the control of the voltage of the pull-down node QB.

In an embodiment of the present disclosure, a potential of the first voltage signal from the first voltage signal terminal VSS may be higher than a potential of the second voltage signal from the second voltage signal terminal VSSL. Therefore, when the control circuit 130 provides the second voltage signal to the pull-down node QB, the next-stage start signal and the output signal outputted from the next-stage start circuit 120 and the output circuit 150 are more stable. For example, the potential of the first voltage signal is −8V, and the potential of the second voltage signal is −10V.

In an embodiment of the present disclosure, a high level of the second clock signal begins when a high level of the first clock signal ends, and a high level of the third clock signal begins when a high level of the second clock signal ends.

At present, a shift register unit usually triggers a shift register signal under the control of a trigger signal, that is, outputs a gate driving signal, whereby only one row of pixels can be driven. An entire gate driving circuit uses a large number of shift register units, occupying a large area and resulting in high cost.

According to an embodiment of the present disclosure, the shift register unit may output at least one gate driving signal under the control of one trigger signal STU, that is, trigger at least one shift register signal. By controlling the respective control clock signals to adjust the respective output signals, the structure is simple, and the number of shift register units used in the display device is reduced.

It is noted that the second clock signal CLK2 for controlling the next-stage start circuit 120 does not provide a high level continuously, but provides a high level only during operation, and thus the power consumption of the shift register unit can be reduced.

Figure 2:
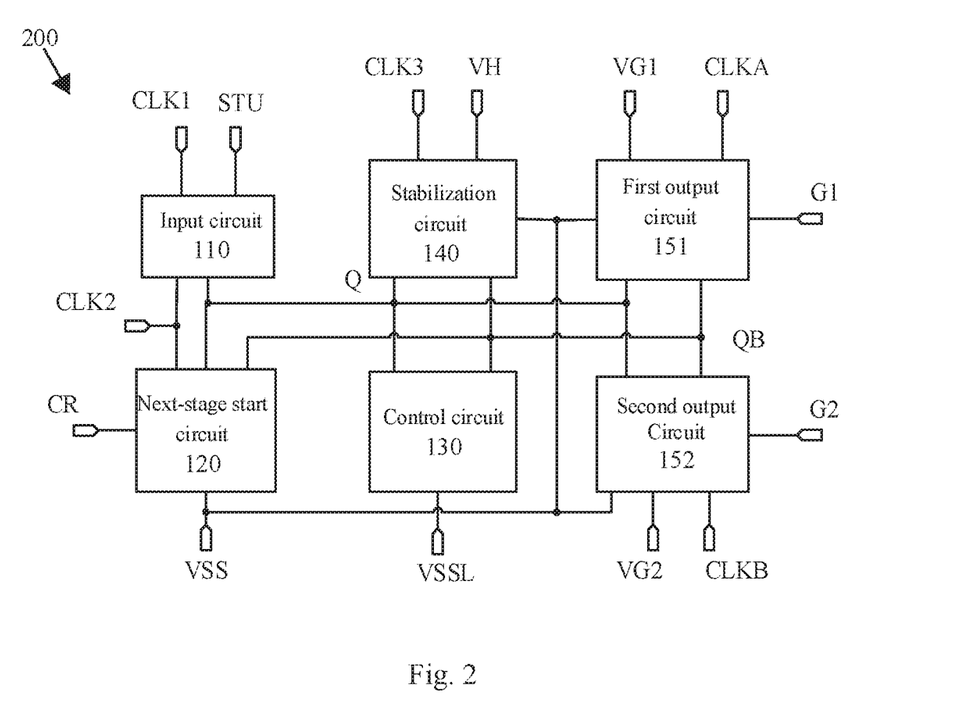
FIG. 2 is a schematic block diagram of a shift register unit according to another embodiment of the present disclosure.

FIG. 2 shows a schematic block diagram of a shift register unit 200 according to another embodiment of the present disclosure. As shown in FIG. 2, the input circuit 110, the next-stage start circuit 120, the control circuit 130, and the stabilization circuit 140 of the shift register unit 200 are the same as those in the shift register unit 100 shown in FIG. 1. Further, the shift register unit 200 further includes a first output circuit 151 and a second output circuit 152.

The first output circuit 151 can be coupled to the pull-up node Q, the pull-down node QB, the first voltage signal terminal VSS, the first control clock signal terminal CLKA, the first control voltage signal terminal VG1, and the first signal output terminal G1. The first output circuit 151 can output a first output signal G1 from the first signal output terminal G1 according to the voltage of the pull-up node Q, the voltage of the pull-down node QB, the first voltage signal from the first voltage signal terminal VSS, the first control clock signal from the first control clock signal terminal CLKA, and the first control voltage signal from the first control voltage signal terminal VG1. Specifically, the first output circuit 151 can provide the first control voltage signal from the first control voltage signal terminal VG1 to the first signal output terminal G1 under the control of the voltage of the pull-up node Q, or provide the first voltage signal from the first voltage signal terminal VSS to the first signal output terminal G1 under the control of the pull-down node QB.

The second output circuit 152 can be coupled to the pull-up node Q, the pull-down node QB, the first voltage signal terminal VSS, the second control clock signal terminal CLKB, the second control voltage signal terminal VG2, and the second signal output terminal G2. The second output circuit 152 can output a second output signal G2 from the second signal output terminal G2 according to the voltage of the pull-up node Q, the voltage of the pull-down node QB, the first voltage signal from the first voltage signal terminal VSS, the second control clock signal from the second control clock signal terminal CLKB, and the second control voltage signal from the second control voltage signal terminal VG2. Specifically, the second output circuit 152 can provide the second control voltage signal from the second control voltage signal terminal VG2 to the second signal output terminal G2 under the control of the voltage of the pull-up node Q, or provide the first voltage signal from the first voltage signal terminal VSS to the second signal output terminal G2 under the control of the pull-down node QB.

In an embodiment of the present disclosure, the first voltage signal from the first voltage signal terminal VSS and the second voltage signal from the second voltage signal terminal VSSL are low level signals. The third voltage signal from the third voltage signal terminal VH, the first control voltage signal from the first control voltage signal terminal VG1, and the second control voltage signal from the second control voltage signal terminal VG2 are high level signals.

According to an embodiment of the present disclosure, the shift register unit may output two gate driving signals (e.g., the first output signal G1 and the second output signal G2) under the control of one trigger signal STU, that is, trigger two shift register signals. By adjusting the output signals according to the first control clock signal CLKA and the second control clock signal CLKB, the structure is simple, and the number of shift register units used in the display device is reduced.

Figure 3:
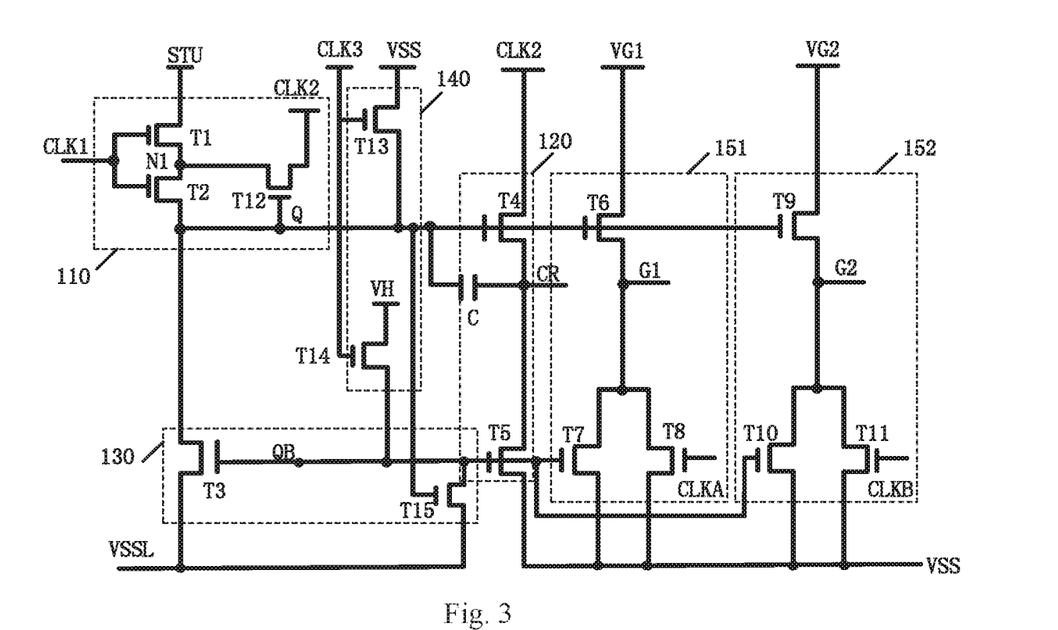
FIG. 3 is an exemplary circuit diagram of the shift register unit shown in FIG. 2.

FIG. 3 shows an exemplary circuit diagram of the shift register unit 200 shown in FIG. 2. In an embodiment, the transistors employed may be N-type transistors or P-type transistors. Specifically, the transistors may be N-type or P-type field effect transistors (MOSFETs), or N-type or P-type bipolar transistors (BJTs). In an embodiment of the present disclosure, the gate of a transistor is referred to as a control electrode. Since the source and the drain of the transistor are symmetrical, the source and the drain are not distinguished, that is, the source of the transistor can be the first electrode (or the second electrode), and the drain can be the second electrode (or the first electrode). Further, any controlled switch device having a gating signal input can be used to implement the function of the transistor, and the controlled middle terminal of the switch device for receiving a control signal (e.g., for turning the controlled switch device on and off) is referred to as the control electrode, while the other two terminals are referred to as the first electrode and the second electrode, respectively. Hereinafter, the following detailed description will be given by example of N-type field effect transistors (NMOSs).

In an embodiment of the present disclosure, each of the at least one output circuit includes a pull-up transistor, a pull-down transistor, and a control transistor. A control electrode of the pull-up transistor is coupled to the pull-up node, a first electrode of the pull-up transistor is coupled to the control voltage signal terminal, and a second electrode of the pull-up transistor is coupled to the signal output terminal. A control electrode of the pull-down transistor is coupled to the pull-down node, a first electrode of the pull-down transistor is coupled to the first voltage signal terminal, and a second electrode of the pull-down transistor is coupled to the signal output terminal. A control electrode of the control transistor is coupled to the control clock signal terminal, a first electrode of the control transistor is coupled to the first voltage signal terminal, and a second electrode of the control transistor is coupled to the signal output terminal.

As shown in FIG. 3, the input circuit 110 may include a first transistor T1, a second transistor T2, and a twelfth transistor T12. A control electrode of the first transistor T1 is coupled to the first clock signal terminal CLK1, a first electrode of the first transistor T1 is coupled to the trigger signal terminal STU, and a second electrode of the first transistor T1 is coupled to the first node N1 (i.e., electrode of the second transistor T2). A control electrode of the second transistor T2 is coupled to the first clock signal terminal CLK1, a first electrode of the second transistor T2 is coupled to the first node N1 (i.e., second electrode of the first transistor T1), and a second electrode of the second transistor T2 is coupled to the pull-up node Q. A control electrode of the twelfth transistor T12 is coupled to the pull-up node Q, a first electrode of the twelfth transistor T12 is coupled to the first node N1, and a second electrode of the twelfth transistor T12 is coupled to the second clock signal terminal CLK2.

The next-stage start circuit 120 includes a fourth transistor T4, a fifth transistor T5, and a first capacitor C. A control electrode of the fourth transistor T4 is coupled to the pull-up node Q, a first electrode of the fourth transistor T4 is coupled to the second clock signal terminal CLK2, and a second electrode of the fourth transistor T4 is coupled to the next-stage start signal output terminal CR. A control electrode of the fifth transistor T5 is coupled to the pull-down node QB, a first electrode of the fifth transistor T5 is coupled to the first voltage signal terminal VSS, and a second electrode of the fifth transistor T5 is coupled to the next-stage start signal output terminal CR. The first capacitor C is coupled between the pull-up node Q and the next-stage start signal output terminal CR.

The control circuit 130 includes a third transistor T3 and a fifteenth transistor T15. A control electrode of the third transistor T3 is coupled to the pull-down node QB, a first electrode of the third transistor T3 is coupled to the second voltage signal terminal VSSL, and a second electrode of the third transistor T3 is coupled to the pull-up node Q. A control electrode of the fifteenth transistor T15 is coupled to the pull-up node Q, a first electrode of the fifteenth transistor T15 is coupled to the second voltage signal terminal VSSL, and a second electrode of the fifteenth transistor T15 is coupled to the pull-down node QB.

The stabilization circuit 140 includes a thirteenth transistor T13 and a fourteenth transistor T14. A control electrode of the thirteenth transistor T13 is coupled to the third clock signal terminal CLK3, a first electrode of the thirteenth transistor T13 is coupled to the first voltage signal terminal VSS, and a second electrode of the thirteenth transistor T13 is coupled to the pull-up node Q. A control electrode of the fourteenth transistor T14 is coupled to the third clock signal terminal CLK3, a first electrode of the fourteenth transistor T14 is coupled to the third voltage signal terminal VH, and a second electrode of the fourteenth transistor T14 is coupled to the pull-down node QB.

The first output circuit 151 includes a sixth transistor T6 (corresponding to the pull-up transistor), a seventh transistor T7 (corresponding to the pull-down transistor), and an eighth transistor T8 (corresponding to the control transistor). A control electrode of the sixth transistor T6 is coupled to the pull-up node Q, a first electrode of the sixth transistor T6 is coupled to the first control voltage signal terminal VG1, and a second electrode of the sixth transistor T6 is coupled to the first signal output terminal (i.e., a second electrode of the seventh transistor T7). A control electrode of the seventh transistor T7 is coupled to the pull-down node QB, a first electrode of the seventh transistor T7 is coupled to the first voltage signal terminal VSS, and the second electrode of the seventh transistor T7 is coupled to the second electrode of the sixth transistor T6. A control electrode of the eighth transistor T8 is coupled to the first control clock signal terminal CLKA, a first electrode of the eighth transistor T8 is coupled to the first voltage signal terminal VSS, and a second electrode of the eighth transistor T8 is coupled to the second electrode of the sixth transistor T6. In the embodiment of the present disclosure, the width to a length ratio of the seventh transistor T7 is an integer multiple of a width to length ratio of the sixth transistor T6.

The second output circuit 152 includes a ninth transistor T9 (corresponding to the pull-up transistor), a tenth transistor T10 (corresponding to the pull-down transistor), and an eleventh transistor T11 (corresponding to the control transistor). A control electrode of the ninth transistor T9 is coupled to the pull-up node Q, a first electrode of the ninth transistor T9 is coupled to the second control voltage signal terminal VG2, and a second electrode of the ninth transistor T9 is coupled to the second signal output terminal (i.e., a second transistor of the tenth transistor T10). A control electrode of the tenth transistor T10 is coupled to the pull-down node QB, a first electrode of the tenth transistor T10 is coupled to the first voltage signal terminal VSS, and the second electrode of the tenth transistor T10 is coupled to the second electrode of the ninth transistor T9. A control electrode of the eleventh transistor T11 is coupled to the second control clock signal terminal CLKB, a first electrode of the eleventh transistor T11 is coupled to the first voltage signal terminal VSS, and a second electrode of the eleventh transistor T11 is coupled to the second electrode of the ninth transistor T9. In an embodiment of the present disclosure, a width to length ratio of the tenth transistor T10 is an integer multiple of a width to length ratio of the ninth transistor T9.

The operation process of the shift register unit shown in FIG. 3 will be described in detail below with reference to the timing diagram shown in FIG. 4. In the following description, the transistors in the shift register unit are all N-type transistors, as an example. The first voltage signal VSS and the second voltage signal VSSL are low level signals. The potential of the first voltage signal from the first voltage signal terminal VSS is higher than the potential of the second voltage signal from the second voltage signal terminal VSSL. The third voltage signal VH, the first control voltage signal VG, and the second control voltage signal VG2 are high level signals.

Figure 4:
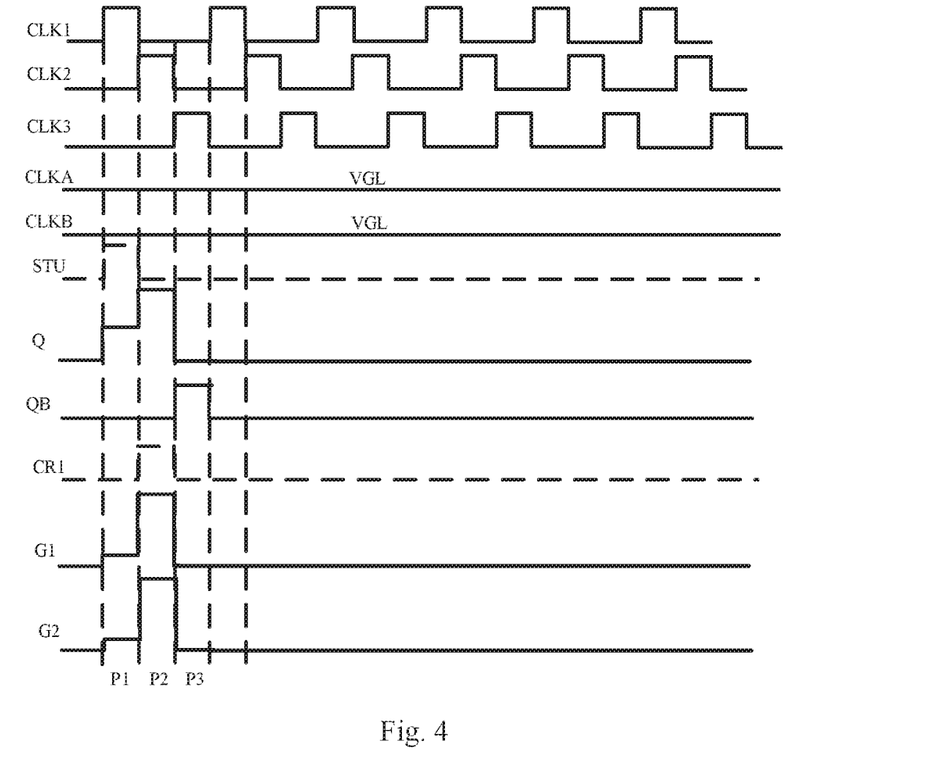
FIG. 4 is a timing diagram of signals of a shift register unit according to an embodiment of the present disclosure.

In the example shown in FIG. 4, the first control clock signal CLKA and the second control clock signal CLKB are low level signals (VGL). Therefore, the eighth transistor T8 and the eleventh transistor T11 are maintained to be turned off.

In a first period (P1), the first clock signal CLK1 is a high level signal, the second clock signal CLK2 is a low level signal, the third clock signal CLK3 is a low level signal, and the trigger signal STU is a high level signal. During P1, the first transistor T1 and the second transistor T2 of the input circuit 110 are turned on, such that the trigger signal STU is provided to the pull-up node Q via the first node N1, to increase the voltage of the pull-up node Q. The fifteenth transistor T15 is turned on, such that the second voltage signal VSSL is provided to the pull-down node QB to pull the voltage of the pull-down node QB down. Therefore, the third transistor T3, the fifth transistor T5, the seventh transistor T7, and the tenth transistor T10 are turned off. Under the control of the voltage of the pull-up node Q, by controlling the ratio of the width to length ratio of the seventh transistor T7 to the width to length ratio of the sixth transistor T6 and controlling the ratio of the width to length ratio of the tenth transistor T10 to the width to length ratio of the ninth transistor T9, both the first output terminal G1 and the second signal output terminal G2 output a low level signal. The fourth transistor T4 is turned on to provide the second clock signal CLK2 to the next-stage start signal output terminal CR, that is, the next-stage start signal output terminal CR also outputs a low level signal. In real simulation, during P1, the signals outputted from the next-stage start signal output terminal CR, the first signal output terminal G1, and the second signal output terminal G2 vary slightly, but can still be regarded as low level signals. In the example, the width to length ratio of the seventh transistor T7 is set to be an integral multiple of the width to length ratio of the sixth transistor T6, and the width to length ratio of the tenth transistor T10 is set to be an integral multiple of the width to length ratio of the ninth transistor T9.

In a second period (P2), the first clock signal CLK1 is a low level signal, the second clock signal CLK2 is a high level signal, the third clock signal CLK3 is a low level signal, and the trigger signal STU is a low level signal. During P1, since the voltage of the pull-up node Q is increased to turn on the fourth transistor T4, the second clock signal CLK2 is transmitted to the next-stage start signal output terminal CR through the fourth transistor T4, so that the next-stage start signal output terminal CR outputs a high level signal. Through the capacitor C, the voltage of the pull-up node Q is further pulled up to a high level due to bootstrapping. The twelfth transistor T12 is turned on to provide the second clock signal CLK2 to the first node N1.

In this way, the voltage of the first node N1 (i.e. a source voltage of the second transistor T2) is at a high level, and is higher than the potential of the first clock signal CLK1 (i.e., a gate voltage of the second transistor T2). The gate-source voltage Vgs of the second transistor T2 is below 0. Therefore, the second transistor T2 is turned off more thoroughly, further reducing the leakage current through the second transistor T2 and the first transistor T1 from the pull-up node Q to the trigger signal terminal STU. Therefore, the voltage of the pull-up node can be stabilized.

Further, the sixth transistor T6 and the ninth transistor T9 are turned on to provide the first control voltage signal VG1 to the first signal output terminal G1 and provide the second control voltage signal VG2 to the second signal output terminal G2, respectively. In the case where the voltage of the pull-up node Q is a third level signal, the fifteenth transistor T15 remains to be turned on to provide the second voltage signal VSSL to the pull-down node QB. Therefore, the voltage of the pull-down node QB (i.e. gate voltages of the fifth transistor T5, the seventh transistor T7, and the tenth transistor T10) is equal to the potential of the second voltage signal VSSL at a low level. Since the source voltages of the fifth transistor T5, the seventh transistor T7, and the tenth transistor T10 are provided with the first voltage signal VSS, the potential of which is higher than that of the second voltage signal VSSL, the gate-source voltage Vgs of these transistors are below 0. Therefore, the fifth transistor T5, the seventh transistor T7, and the tenth transistor T10 are turned off thoroughly, further reducing the leakage current from the next-stage start signal output terminal and the respective signal output terminals through such transistors. In this way, stable high level signals are outputted from the next-stage start signal output terminal CR, the first signal output terminal G1, and the second signal output terminal G2. Therefore, it can perform full swing output, realizing rail-to-rail output.

In a third period (P3), the first clock signal CLK1 is a low level signal, the second clock signal CLK2 is a low level signal, the third clock signal CLK3 is a high level signal, and the trigger signal STU is a low level signal. During P3, the thirteenth transistor T13 and the fourteenth transistor T14 are turned on to provide the first voltage signal VSS to the pull-up node Q and provide the third voltage signal VH to the pull-down node QB, such that the voltage of the pull-up node Q is pulled low and the voltage of the pull-down node QB is pulled high. The fourth transistor T4, the sixth transistor T6, and the ninth transistor T9 are turned off, and the fifth transistor T5, the seventh transistor T7, and the tenth transistor T10 are turned on. A low level signal is outputted from the next-stage start signal output terminal CR, a low level signal is outputted from the first signal output terminal G1, and a low level signal is outputted from the second signal output terminal G2.

In a subsequent period, the first clock signal CLK1, the second clock signal CLK2, and the third clock signal CLK3 provides a high level signal sequentially, the trigger signal STU is maintained at a low level, and the next-stage start signal output terminal CR, the first signal output terminal G1, and the second signal output terminal G2 outputs low level signals.

Figure 5:
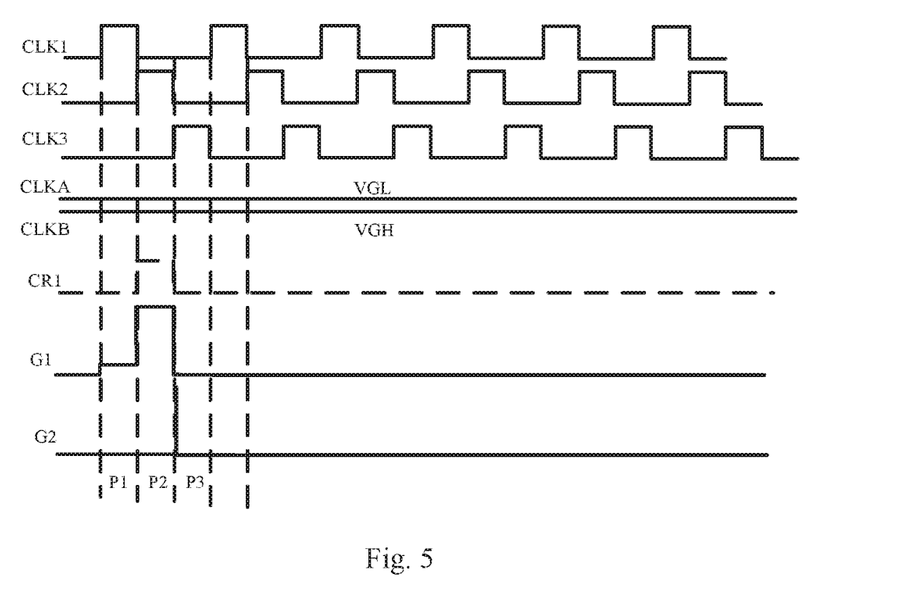
FIG. 5 is a timing diagram of signals of a shift register unit according to another embodiment of the present disclosure.

In another embodiment of the present disclosure, one of the first control clock signal CLKA and the second control clock signal CLKB is a low level signal, and the other is a high level signal. For example, the first control clock signal CLKA is a low level signal (VGL), and the second control clock signal CLKB is a high level signal (VGH). Therefore, the eighth transistor T8 is turned off, and the eleventh transistor T11 is turned on. As shown in FIG. 5, the first output signal outputted from the first signal output terminal G1 is the same as that of FIG. 4, and the second signal output terminal G2 outputs a low level signal.

Alternatively, when the first control clock signal CLKA is a high level signal (VGH) and the second control clock signal CLKB is a low level signal (VGL), the eighth transistor T8 is turned on, and the eleventh transistor T11 is turned off. The first signal output terminal G1 outputs a low level signal, and the second output signal outputted from the second signal output terminal G2 is the same with that of FIG. 4.

Therefore, the two output signals can be controlled by correspondingly adjusting the first control clock signal CLKA and the second control clock signal CLKB.

In an embodiment of the present disclosure, the first clock signal CLK1, the second clock signal CLK2, and the third clock signal CLK3 may have the same clock period and the same ratio of high level to low level of 1:2.

Figure 6:
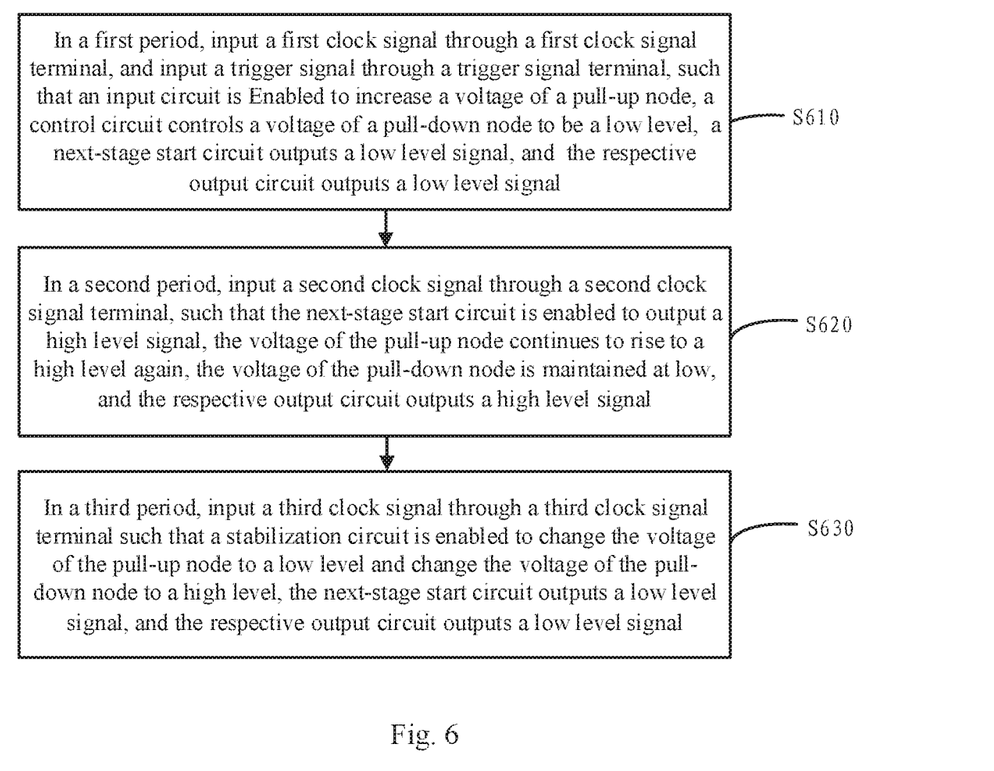
FIG. 6 is a schematic flow chart of a method for driving the shift register unit as shown in FIG. 3.

FIG. 6 is a schematic flowchart of a method for driving a shift register unit according to an embodiment of the present disclosure, wherein a control clock signal of a control clock signal terminal of at least one output circuit is a low level signal. In an embodiment of the present disclosure, the first voltage signal VSS and the second voltage signal VSSL are low level signals, and the third voltage signal VH and each control voltage signal VG of the at least one output circuit are high level signals.

In step S610, in the first period, a first clock signal (for example, a high level signal) is inputted through the first clock signal terminal, and a trigger signal is inputted through the trigger signal terminal, such that the input circuit is enabled to provide the trigger signal to a first node, and provide the voltage of the first node to the pull-up node, such that the pull-up node is increased to a high level. The control circuit controls the voltage of the pull-down node to be a low level. Since the second clock signal and the respective control voltage signal are at low levels, next-stage start signal output terminal of the next-stage start circuit outputs a low level signal, and the signal output terminal of respective output circuit outputs a low level signal.

In step S620, in the second period, a second clock signal (for example, a high level signal) is inputted through the second clock signal terminal, such that the next-stage start circuit is enabled to output a high level signal from the next-stage start signal output terminal of the next-stage start circuit, the voltage of the pull-up node continues rising to a high level, the voltage of the pull-down node is maintained at a low level, and the signal output terminal of the respective output circuit outputs a high level signal. Moreover, the input circuit provides the high level second clock signal to the first node, such that there is no leakage current flowing through the input circuit from the pull-up node.

In step S630, in the third period, a third clock signal (for example, a high level signal) is inputted through the third clock signal terminal, such that the stabilization circuit is enabled to change the voltage of the pull-up node to a low level and change the voltage of the pull-down node to a high level, the next-stage start signal output terminal of the next-stage start circuit outputs a low level signal, and the signal output terminal of the respective output circuit outputs a low level signal.

In another embodiment of the present disclosure, the control clock signal of the control clock signal terminal of one or more of the at least one output circuit is a high level signal. In this case, the signal output terminal of the one or more output circuits output low level signals.

From the above, according to an embodiment of the present disclosure, by changing the control clock signal of the control clock signal terminal of one or more of the at least one output circuit, one or more driving signals can be outputted under the control of one trigger signal. Furthermore, leakage currents and device power consumption can be reduced according to the embodiment of the present disclosure.

Generally, when the OLED display panel operates in a normal state, the threshold voltage Vth may be unstable. In this case, it may occur a shift of the threshold voltage Vth due to a long time of operation. Therefore, the design of pixel circuits of the OLED display panel needs to take compensation for the threshold voltage Vth, mobility compensation, and optical compensation into account. The shift register unit according to the embodiment of the present disclosure can be applied to, for example, an AMOLED 3T1C pixel circuit to perform better external compensation.

Figure 7:
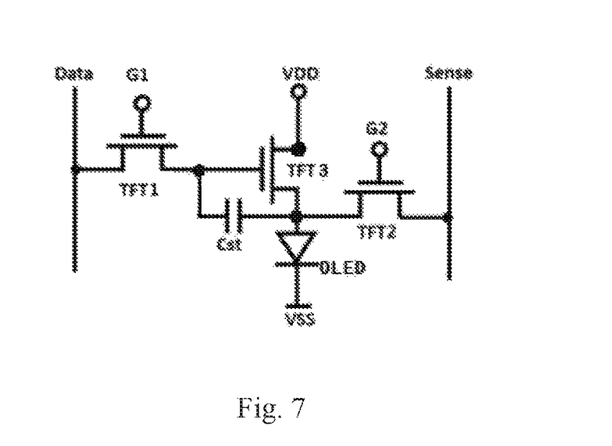
FIG. 7 is a circuit diagram of a 3T1C pixel circuit.

FIG. 7 shows a circuit diagram of a 3T1C pixel circuit. As shown in FIG. 4, the 3T1C circuit includes a switch transistor TFT1, a sensing transistor TFT2, a driving transistor TFT3, a storage capacitor CST, and a light emitting diode OLED. The switch transistor TFT1, the sensing transistor TFT2, and the driving transistor TFT3 are all N-type transistor TFTs.

A control electrode of the switch transistor TFT1 is coupled to the first signal output terminal G1 of the shift register unit 200 shown in FIG. 2, a first electrode of the switch transistor TFT1 is coupled to the data write signal Data, and a second electrode of the switch transistor TFT1 is coupled to a control electrode of the driving transistor TFT3. A control electrode of the sensing transistor TFT2 is coupled to the second signal output terminal G2 of the shift register unit shown in FIG. 2, a first electrode of the sensing transistor TFT2 is coupled to a sensing signal Sense, and a second electrode of the sensing transistor TFT2 is coupled to the second electrode of the driving transistor TFT3. The first electrode of the driving transistor TFT3 is coupled to a high level signal VDD. The storage capacitor CST is coupled between the second electrode of the switch transistor TFT1 and the second electrode of the driving transistor TFT3. The anode of the light emitting diode OLED is coupled to the second electrode of the driving transistor TFT3, and the cathode of the light emitting diode OLED is coupled to a low level signal VSS.

In an embodiment of the present disclosure, in a normal writing phase, the first output signal G1 and the second output signal G2 are configured firstly, that is, the first control clock signal CLKA and the second control clock signal CLKB are both low level signals. Thus, in the second period described above, the first output signal G1 and the second output signal G2 are both at high level. After a short time, the first control clock signal CLKA is maintained at low, the second control clock signal CLKB is configured to a high level, to maintain the first output signal G1 at high, and change the second output signal G2 to a low level so as to perform data writing. Under the control of the first output signal G1, the data write signal Data is transmitted to the switch transistor TFT1, that is, the control electrode of the driving transistor TFT3. Further, under the control of the data write signal Data, the high level signal VDD is transferred to the second electrode of the driving transistor TFT3, thereby driving the light emitting diode OLED to emit light.

In a sensing compensation phase, the first control clock signal CLKA and the second control clock signal CLKB are both at a low level. Therefore, in the second period described above, the first output signal G1, and the second output signal G2 are both maintained high. In addition to the operation of transferring the data write signal DATA to the control electrode of the driving transistor TFT3 to write data in the normal writing phase described above, under the control of the second output signal G2, the sensing compensation signal Sense is transferred to the second electrode of the sensing transistor TFT 2, that is, the second electrode of the driving transistor TFT3, and the voltage of the control electrode of the driving transistor TFT3 is pulled up, through the storage capacitor CST, to the voltage of the second electrode of the driving transistor TFT3, thereby further controlling the current driving the light emitting diode OLED.

In an embodiment of the present disclosure, the shift register unit outputs two driving signals, that is, the first output signal G1 and the second output signal G2, under the control of one trigger signal STU, so as to provide a better control of the 3T1C pixel circuit. The shift register unit of the embodiment of the present disclosure has a simple structure and can reduce power consumption and current leakage.

Figure 8:
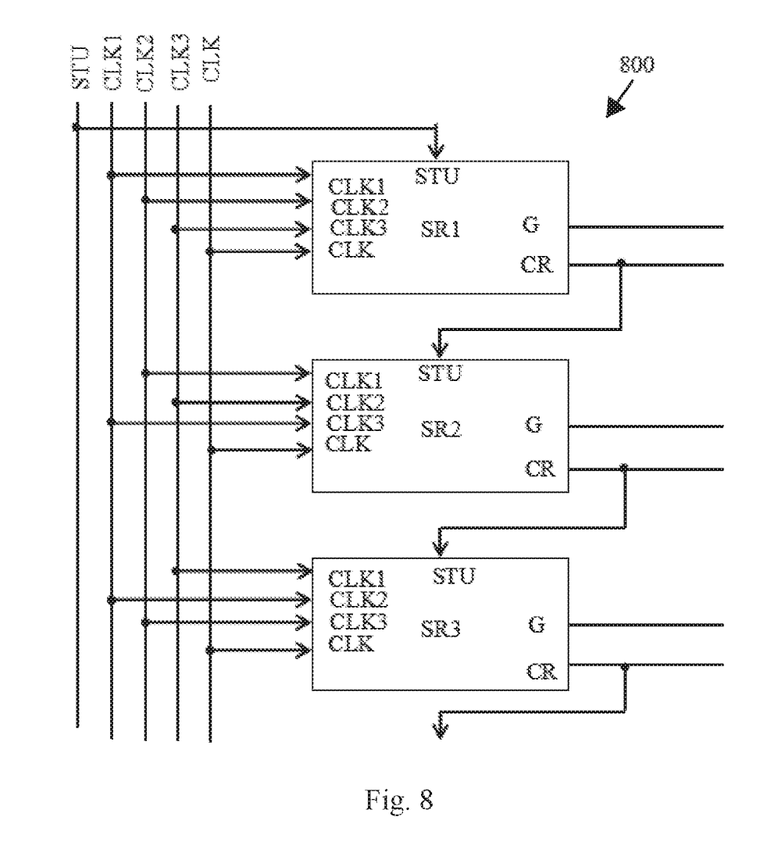
FIG. 8 is a schematic diagram of a gate driving circuit according to an embodiment of the present disclosure.

FIG. 8 shows a schematic structural diagram of a gate driving circuit 800 according to an embodiment of the present disclosure. As shown in FIG. 8, the gate driving circuit 800 may include a plurality of cascaded shift register units SR1, SR2, . . . , SRn, SR(n+1), and so on. The shift register unit of each stage can adopt the structure of the shift register unit 100 as shown in FIG. 1.

In the gate driving circuit 800, ports of the respective stage of the shift register unit may include a first voltage signal terminal VSS, a second voltage signal terminal VSSL, a third voltage signal terminal VH, at least one control voltage signal terminal VG (only one shown), a first clock signal terminal CLK, a second clock signal terminal CLK2, a third clock signal terminal CLK3, at least one control clock signal terminal CLK (only one shown), a trigger signal terminal STU, a next-stage start signal output terminal CR and at least one signal output terminal G (only one shown).

A next-stage start signal output terminal CR of the respective stages of shift register unit SR(n) is coupled to the trigger signal terminal STU of the next stage of shift register unit SR(n+1). A first clock signal terminal of a (3n+1)-stage of shift register unit is coupled to a third clock signal terminal of a (3n+2)-stage of shift register unit and to a second clock signal terminal of a (3n+3)-stage of shift register unit, a second clock signal terminal of the (3n+1)-stage of shift register unit is coupled to a first clock signal terminal of the (3n+2)-stage of shift register unit and to a third clock signal terminal of the (3n+3)-stage of shift register unit. A third clock signal terminal of the (3n+1)-stage of shift register unit is coupled to a second clock signal terminal of the (3n+2)-stage of shift register unit and to a first clock signal terminal of the (3n+3)-stage of shift register unit. N is a positive integer.

A first voltage signal of a low level (for example, −8V) is inputted to the first voltage signal terminal VSS, and a second voltage signal of a low level (for example, −10V) is inputted to the second voltage signal terminal VSSL, a third voltage signal of a high level (for example, 25V) is inputted to the third voltage signal terminal VH. Thus, the respective signal output terminal G can perform full swing output, realizing rail-to-rail output.

In an embodiment of the present disclosure, a high level of the second clock signal begins when a high level of the first clock signal ends, and a high level of the third clock signal begins when a high level of the second clock signal ends. Further, the first clock signal, the second clock signal, and the third clock signal may have a same clock period and a same ratio of high level to low level of 1:2.

Figure 9:
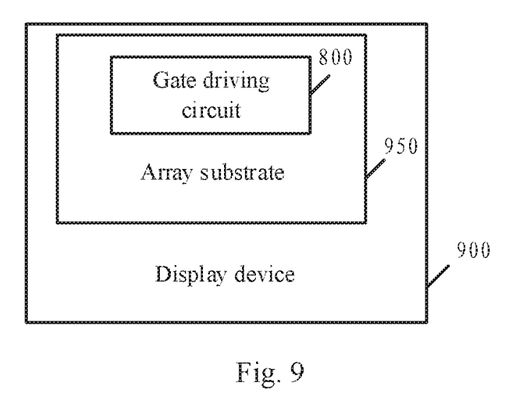
FIG. 9 is a schematic diagram of a display device according to an embodiment of the present disclosure.

FIG. 9 shows a schematic diagram of a display device 900 according to an embodiment of the present disclosure. The display device 900 includes an array substrate 950, wherein the array substrate 950 includes the gate driving circuit 800 shown in FIG. 8. The display device 900 can be, for example, a mobile phone, a tablet computer, a display screen, a wearable device, and the like.

The shift register unit according to an embodiment of the present disclosure can output at least one gate driving signal under the control of one trigger signal using only a small number of components, and adjust the output signal of each output circuit through the control clock signal of each output circuit. Therefore, it can be better applied to pixel circuits and reduce the complexity and area of the wiring of gate driving circuits. Furthermore, the shift register unit according to the embodiment of the present disclosure can also reduce signal noise, power consumption, and current leakage.

Several embodiments of the present disclosure have been described in detail above, but the scope of protection of the present disclosure is not limited thereto. It is apparent to those of ordinary skill in the art that various modifications, substitutions or changes may be made to the embodiments of the present disclosure without departing from the spirit and scope of the present disclosure. The scope of protection of the present disclosure is defined by the appended claims.

What is claimed is:

1. A shift register unit comprising:
   an input circuit configured to provide a trigger signal from a trigger signal terminal to a first node according to a first clock signal from a first clock signal terminal, provide a voltage of the first node to a pull-up node according to the first clock signal, and provide a second clock signal from a second clock signal terminal to the first node according to a voltage of the pull-up node such that there is no leakage current flowing through the input circuit from the pull-up node;
   a next-stage start circuit configured to output a next-stage start signal from a next-stage start signal output terminal according to the voltage of the pull-up node, a voltage of a pull-down node, a second clock signal from a second clock signal terminal, and a first voltage signal from a first voltage signal terminal;
   a control circuit configured to control the voltage of the pull-down node according to the voltage of the pull-up node and a second voltage signal from a second voltage signal terminal, and control the voltage of the pull-up node according to the voltage of the pull-down node and the second voltage signal;
   a stabilization circuit configured to control the voltage of the pull-up node and the voltage of the pull-down node according to a third clock signal from a third clock signal terminal, the first voltage signal, and a third voltage signal from a third voltage signal terminal; and
   at least one output circuit each configured to output an output signal from a signal output terminal according to the voltage of the pull-up node, the voltage of the pull-down node, the first voltage signal, a control clock signal from a control clock signal terminal, and a control voltage signal from a control voltage signal terminal, wherein a high level of the second clock signal begins when a high level of the first clock signal ends, and wherein a high level of the third clock signal begins when a high level of the second clock signal ends.

2. The shift register unit according to claim 1, wherein each of the at least one output circuit comprises a pull-up transistor, a pull-down transistor, and a control transistor;
   wherein a control electrode of the pull-up transistor is coupled to the pull-up node, wherein a first electrode of the pull-up transistor is coupled to the control voltage signal terminal, and wherein a second electrode of the pull-up transistor is coupled to the signal output terminal;
   wherein a control electrode of the pull-down transistor is coupled to the pull-down node, wherein a first electrode of the pull-down transistor is coupled to the first voltage signal terminal, and wherein a second electrode of the pull-down transistor is coupled to the signal output terminal; and
   wherein a control electrode of the control transistor is coupled to the control clock signal terminal, wherein a first electrode of the control transistor is coupled to the first voltage signal terminal, and wherein a second electrode of the control transistor is coupled to the signal output terminal.

3. The shift register unit according to claim 1, wherein the at least one output circuit comprises:
   a first output circuit configured to output a first output signal from a first signal output terminal according to the voltage of the pull-up node, the voltage of the pull-down node, the first voltage signal, a first control clock signal from a first control clock signal terminal, and a first control voltage signal from a first control voltage signal terminal; and
   a second output circuit configured to output a second output signal from a second signal output terminal according to the voltage of the pull-up node, the voltage of the pull-down node, the first voltage signal, a second control clock signal from a second control clock signal terminal, and a second control voltage signal from a second control voltage signal terminal.

4. The shift register unit according to claim 3, wherein the first output circuit comprises a sixth transistor, a seventh transistor, and an eighth transistor;
   wherein a control electrode of the sixth transistor is coupled to the pull-up node, wherein a first electrode of the sixth transistor is coupled to the first control voltage signal terminal, and wherein a second electrode of the sixth transistor is coupled to the first signal output terminal;
   wherein a control electrode of the seventh transistor is coupled to the pull-down node, wherein a first electrode of the seventh transistor is coupled to the first voltage signal terminal, and wherein a second electrode of the seventh transistor is coupled to the first signal output terminal; and
   wherein a control electrode of the eighth transistor is coupled to the first control clock signal terminal, wherein a first electrode of the eighth transistor is coupled to the first voltage signal terminal, and wherein a second electrode of the eighth transistor is coupled to the first signal output terminal.

5. The shift register unit according to claim 4, wherein a width to length ratio of the seventh transistor is an integer multiple of a width to length ratio of the sixth transistor.

6. The shift register unit according to claim 3, wherein the second output circuit comprises a ninth transistor, a tenth transistor, and an eleventh transistor;
   wherein a control electrode of the ninth transistor is coupled to the pull-up node, wherein a first electrode of the ninth transistor is coupled to the second control voltage signal terminal, and wherein a second electrode of the ninth transistor is coupled to the second signal output terminal;

wherein a control electrode of the tenth transistor is coupled to the pull-down node, wherein a first electrode of the tenth transistor is coupled to the first voltage signal terminal, and wherein a second electrode of the tenth transistor is coupled to the second signal output terminal; and wherein a control electrode of the eleventh transistor is coupled to the second control clock signal terminal, wherein a first electrode of the eleventh transistor is coupled to the first voltage signal terminal, and wherein a second electrode of the eleventh transistor is coupled to the second signal output terminal.

7. The shift register unit according to claim 6, wherein a width to length ratio of the tenth transistor is an integer multiple of a width to length ratio of the ninth transistor.

8. The shift register unit according to claim 1, wherein the input circuit comprises a first transistor, a second transistor, and a twelfth transistor, wherein a control electrode of the first transistor is coupled to the first clock signal terminal, wherein a first electrode of the first transistor is coupled to the trigger signal terminal, and wherein a second electrode of the first transistor is coupled to the first node;

wherein a control electrode of the second transistor is coupled to the first clock signal terminal, wherein the first electrode of the second transistor is coupled to the first node, and wherein a second electrode of the second transistor is coupled to the pull-up node; and wherein a control electrode of the twelfth transistor is coupled to the pull-up node, wherein a first electrode of the twelfth transistor is coupled to the first node, and wherein a second electrode of the twelfth transistor is coupled to the second clock signal terminal.

9. The shift register unit according to claim 1, wherein the next-stage start circuit comprises a fourth transistor, a fifth transistor, and a first capacitor;

wherein a control electrode of the fourth transistor is coupled to the pull-up node, wherein a first electrode of the fourth transistor is coupled to the second clock signal terminal, and wherein a second electrode of the fourth transistor is coupled to the next-stage start signal output terminal;

wherein a control electrode of the fifth transistor is coupled to the pull-down node, wherein a first electrode of the fifth transistor is coupled to the first voltage signal terminal, and wherein a second electrode of the fifth transistor is coupled to the next-stage start signal output terminal; and wherein the first capacitor is coupled between the pull-up node and the next-stage start signal output terminal.

10. The shift register unit according to claim 1, wherein the control circuit comprises a third transistor and a fifteenth transistor;

wherein a control electrode of the third transistor is coupled to the pull-down node, wherein a first electrode of the third transistor is coupled to the second voltage signal terminal, and wherein a second electrode of the third transistor is coupled to the pull-up node; and wherein a control electrode of the fifteenth transistor is coupled to the pull-up node, wherein a first electrode of the fifteenth transistor is coupled to the second voltage signal terminal, and wherein a second electrode of the fifteenth transistor is coupled to the pull-down node.

11. The shift register unit according to claim 1, wherein the stabilization circuit comprises a thirteenth transistor and a fourteenth transistor;

wherein a control electrode of the thirteenth transistor is coupled to the third clock signal terminal, wherein a first electrode of the thirteenth transistor is coupled to the first voltage signal terminal, and wherein a second electrode of the thirteenth transistor is coupled to the pull-up node; and wherein a control electrode of the fourteenth transistor is coupled to the third clock signal terminal, wherein a first electrode of the fourteenth transistor is coupled to the third voltage signal terminal, and wherein a second electrode of the fourteenth transistor is coupled to the pull-down node.

12. The shift register unit according to claim 1, wherein the first clock signal, the second clock signal, and the third clock signal have a same clock period and a same ratio of high level to low level of 1:2.

13. A method for driving a shift register unit according to claim 1, wherein a control clock signal of a control clock signal terminal of at least one output circuit is a low level signal, the method comprising:

in a first period, inputting a first clock signal through a first clock signal terminal, and inputting a trigger signal through a trigger signal terminal, such that an input circuit is enabled to provide the trigger signal to a first node and provide the voltage of the first node to a pull-up node, a control circuit controls a voltage of a pull-down node to be a low level, a next-stage start circuit outputs a low level signal, and the respective output circuit outputs a low level signal;

in a second period, inputting a second clock signal through a second clock signal terminal, such that a next-stage start circuit is enabled to output a high level signal, the voltage of the pull-up node continues rising to a high level, the voltage of the pull-down node is maintained at a low level, the respective output circuit outputs a high level signal, and a second clock signal is provided to the first node such that there is no leakage current flowing from the pull-up node; and in a third period, inputting a third clock signal through a third clock signal terminal, such that a stabilization circuit is enabled to change the voltage of the pull-up node to a low level and change the voltage of the pull-down node to a high level, the next-stage start circuit outputs a low level signal, and the respective output circuit outputs a low level signal.

14. The method according to claim 13, wherein the control clock signal of the control clock signal terminal of one or more of the at least one output circuit is a high level signal, the method comprising:

outputting a low level signal from a signal output terminal of the one or more output circuits.

15. A gate driving circuit comprising a plurality of cascaded shift register units, wherein each shift register unit is a shift register unit according to claim 1;

wherein a next-stage start signal output terminal of the respective stage of shift register unit is coupled to a trigger signal terminal of the next stage of shift register unit;

wherein a first clock signal terminal of a (3n+1)-stage of shift register unit is coupled to a third clock signal terminal of a (3n+2)-stage of shift register unit and to a second clock signal terminal of a (3n+3)-stage of shift register unit;

wherein a second clock signal terminal of the (3n+1)-stage of shift register unit is coupled to a first clock signal terminal of the (3n+2)-stage of shift register unit and to a third clock signal terminal of the (3n+3)-stage of shift register unit;

wherein a third clock signal terminal of the (3n+1)-stage of shift register unit is coupled to a second clock signal terminal of the (3n+2)-stage of shift register unit and to a first clock signal terminal of the (3n+3)-stage of shift register unit; and wherein n is a positive integer.

16. An array substrate comprising the gate driving circuit according to claim 15.

17. A display device comprising the array substrate according to claim 16.

18. The gate driving circuit according to claim 15, wherein each of at least one output circuit of the shift register unit comprises a pull-up transistor, a pull-down transistor, and a control transistor;

wherein a control electrode of the pull-up transistor is coupled to the pull-up node, wherein a first electrode of the pull-up transistor is coupled to the control voltage signal terminal, and wherein a second electrode of the pull-up transistor is coupled to the signal output terminal;

wherein a control electrode of the pull-down transistor is coupled to the pull-down node, wherein a first electrode of the pull-down transistor is coupled to the first voltage signal terminal, and wherein a second electrode of the pull-down transistor is coupled to the signal output terminal; and wherein a control electrode of the control transistor is coupled to the control clock signal terminal, wherein a first electrode of the control transistor is coupled to the first voltage signal terminal, and wherein a second electrode of the control transistor is coupled to the signal output terminal.

19. The shift register unit according to claim 1, wherein a potential of the first voltage signal is higher than a potential of the second voltage signal.

20. A shift register unit comprising a first transistor, a second transistor, a twelfth transistor, a fourth transistor, a fifth transistor, a first capacitor, a third transistor, a fifteenth transistor, a thirteenth transistor, a fourteenth transistor, a sixth transistor, a seventh transistor, an eighth transistor, a ninth transistor, a tenth transistor, and an eleventh transistor;

wherein a control electrode of the first transistor is coupled to a first clock signal terminal, wherein a first electrode of the first transistor is coupled to a trigger signal terminal, and wherein a second electrode of the first transistor is coupled to a first electrode of the second transistor;

wherein a control electrode of the second transistor is coupled to the first clock signal terminal, wherein the first electrode of the second transistor is coupled to the second electrode of the first transistor, and wherein a second electrode of the second transistor is coupled to a pull-up node;

wherein a control electrode of the twelfth transistor is coupled to the pull-up node, wherein a first electrode of the twelfth transistor is coupled to the first electrode of the second transistor, and wherein a second electrode of the twelfth transistor is coupled to a second clock signal terminal;

wherein a control electrode of the fourth transistor is coupled to the pull-up node, wherein a first electrode of the fourth transistor is coupled to the second clock signal terminal, and wherein a second electrode of the fourth transistor is coupled to a next-stage start signal output terminal;

wherein a control electrode of the fifth transistor is coupled to a pull-down node, wherein a first electrode of the fifth transistor is coupled to a first voltage signal terminal, and wherein a second electrode of the fifth transistor is coupled to the next-stage start signal output terminal;

wherein the first capacitor is coupled between the pull-up node and the next-stage start signal output terminal;

wherein a control electrode of the third transistor is coupled to the pull-down node, wherein a first electrode of the third transistor is coupled to a second voltage signal terminal, and wherein a second electrode of the third transistor is coupled to the pull-up node;

wherein a control electrode of the fifteenth transistor is coupled to the pull-up node, wherein a first electrode of the fifteenth transistor is coupled to the second voltage signal terminal, and wherein a second electrode of the fifteenth transistor is coupled to the pull-down node;

wherein a control electrode of the thirteenth transistor is coupled to a third clock signal terminal, wherein a first electrode of the thirteenth transistor is coupled to the first voltage signal terminal, and wherein a second electrode of the thirteenth transistor is coupled to the pull-up node;

wherein a control electrode of the fourteenth transistor is coupled to the third clock signal terminal, wherein a first electrode of the fourteenth transistor is coupled to a third voltage signal terminal, and wherein a second electrode of the fourteenth transistor is coupled to the pull-down node;

wherein a control electrode of the sixth transistor is coupled to the pull-up node, wherein a first electrode of the sixth transistor is coupled to a first control voltage signal terminal, and wherein a second electrode of the sixth transistor is coupled to a first signal output terminal;

wherein a control electrode of the seventh transistor is coupled to the pull-down node, wherein a first electrode of the seventh transistor is coupled to the first voltage signal terminal, and wherein a second electrode of the seventh transistor is coupled to the first signal output terminal;

wherein a control electrode of the eighth transistor is coupled to a first control clock signal terminal, wherein a first electrode of the eighth transistor is coupled to the first voltage signal terminal, and wherein a second electrode of the eighth transistor is coupled to the first signal output terminal;

wherein a control electrode of the ninth transistor is coupled to the pull-up node, wherein a first electrode of the ninth transistor is coupled to a second control voltage signal terminal, and wherein a second electrode of the ninth transistor is coupled to a second signal output terminal;

wherein a control electrode of the tenth transistor is coupled to the pull-down node, wherein a first electrode of the tenth transistor is coupled to the first voltage signal terminal, and wherein a second electrode of the tenth transistor is coupled to the second signal output terminal; and wherein a control electrode of the eleventh transistor is coupled to a second control clock signal terminal, wherein a first electrode of the eleventh transistor is coupled to the first voltage signal terminal, and wherein a second electrode of the eleventh transistor is coupled to the second signal output terminal.

* * * * *

UNITED STATES PATENT AND TRADEMARK OFFICE
CERTIFICATE OF CORRECTION

PATENT NO. : 11,087,668 B1
APPLICATION NO. : 16/312101
DATED : August 10, 2021
INVENTOR(S) : Meng Li et al.

It is certified that error appears in the above-identified patent and that said Letters Patent is hereby corrected as shown below:

In the Specification

Column 7, Line 6, delete "terminal CLK" and insert therefor -- terminal CLK1 --.
Column 7, Line 16, delete "terminal CLK" and insert therefor -- terminal CLK1 --.
Column 12, Line 15, delete "signal VG" and insert therefor -- signal VG1 --.
Column 16, Line 34, delete "terminal CLK" and insert therefor -- terminal CLK1 --.

Signed and Sealed this
Twenty-first Day of September, 2021

Drew Hirshfeld
*Performing the Functions and Duties of the
Under Secretary of Commerce for Intellectual Property and
Director of the United States Patent and Trademark Office*